US011889709B2

(12) United States Patent
Forrest et al.

(10) Patent No.: US 11,889,709 B2
(45) Date of Patent: Jan. 30, 2024

(54) MECHANICALLY STACKED TANDEM PHOTOVOLTAIC CELLS WITH INTERMEDIATE OPTICAL FILTERS

(71) Applicant: THE REGENTS OF THE UNIVERSITY OF MICHIGAN, Ann Arbor, MI (US)

(72) Inventors: Stephen R. Forrest, Ann Arbor, MI (US); Kyusang Lee, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/552,303

(22) PCT Filed: Feb. 29, 2016

(86) PCT No.: PCT/US2016/020039
§ 371 (c)(1),
(2) Date: Aug. 21, 2017

(87) PCT Pub. No.: WO2016/138514
PCT Pub. Date: Sep. 1, 2016

(65) Prior Publication Data
US 2018/0047922 A1 Feb. 15, 2018

Related U.S. Application Data

(60) Provisional application No. 62/126,326, filed on Feb. 27, 2015.

(51) Int. Cl.
*H10K 30/20* (2023.01)
*H01L 31/0687* (2012.01)
(Continued)

(52) U.S. Cl.
CPC ...... *H10K 30/211* (2023.02); *H01L 31/02327* (2013.01); *H01L 31/035209* (2013.01);
(Continued)

(58) Field of Classification Search
CPC ... H01L 27/302; H01L 31/043; H01L 31/046; H01L 31/0725; H01L 31/0687;
(Continued)

(56) References Cited

U.S. PATENT DOCUMENTS

2005/0126628 A1\* 6/2005 Scher .................. H01L 31/0352
136/263
2008/0190479 A1 8/2008 Hsieh et al.
(Continued)

FOREIGN PATENT DOCUMENTS

EP 2 760 054 A1 7/2014
JP H02106979 A 4/1990
WO WO-2011118890 A1 \* 9/2011 ........... H01L 27/302

OTHER PUBLICATIONS

International Search Report & Written Opinion, PCT/US2016/020039, dated May 23, 2016.
(Continued)

*Primary Examiner* — Andrew J Golden
(74) *Attorney, Agent, or Firm* — Finnegan, Henderson, Farabow, Garrett & Dunner, LLP (57) ABSTRACT

A method of fabricating a multi-junction photosensitive device is provided. The method may include fabricating at least two photoactive layers, wherein at least one photoactive layer is fabricated on a transparent substrate, and at least one photoactive layer is fabricated on a reflective substrate, patterning at least one optical filter layer on at least one photoactive layer fabricated on a transparent substrate, and bonding the at least two photoactive layers using cold weld or van der Waals bonding. A multi-junction photosensitive
(Continued)

device is also provided. The device may have at least two photoactive layers, and at least one optical filter layer, wherein at least two layers are bonded using cold weld or van der Waals bonding. The optical filter layer may be a Distributed Bragg Reflector.

15 Claims, 6 Drawing Sheets

(51) Int. Cl.
*H01L 31/0725* (2012.01)
*H01L 31/043* (2014.01)
*H01L 31/076* (2012.01)
*H01L 31/0232* (2014.01)
*H01L 31/078* (2012.01)
*H10K 30/57* (2023.01)
*H10K 30/87* (2023.01)
*H10K 85/20* (2023.01)
*H01L 31/054* (2014.01)
*H01L 31/101* (2006.01)
*H01L 31/0352* (2006.01)

(52) U.S. Cl.
CPC .... *H01L 31/035218* (2013.01); *H01L 31/043* (2014.12); *H01L 31/0547* (2014.12); *H01L 31/0687* (2013.01); *H01L 31/076* (2013.01); *H01L 31/078* (2013.01); *H01L 31/0725* (2013.01); *H01L 31/1013* (2013.01); *H10K 30/57* (2023.02); *H10K 30/87* (2023.02); *H10K 85/215* (2023.02); *H10K 85/211* (2023.02); *Y02E 10/52* (2013.01); *Y02E 10/544* (2013.01); *Y02E 10/548* (2013.01); *Y02E 10/549* (2013.01)

(58) Field of Classification Search
CPC . H01L 31/076; H01L 31/078; H01L 31/0549; H01L 31/035218; H01L 31/02327; H01L 51/4213; H01L 51/445; H01L 51/4246; H01L 51/447; H01L 31/03521; H01L 31/0547; H10K 30/57; H10K 30/211; H10K 85/215

USPC .................................................. 136/243–265
See application file for complete search history.

(56) References Cited

U.S. PATENT DOCUMENTS

| | | | |
|---|---|---|---|
| 2010/0059111 A1 | 3/2010 | Shin et al. | |
| 2010/0122764 A1* | 5/2010 | Newman | H01L 31/06875 156/247 |
| 2010/0147366 A1 | 6/2010 | Stan et al. | |
| 2010/0269896 A1* | 10/2010 | Sheng | H01L 31/0236 136/255 |
| 2011/0155207 A1* | 6/2011 | Singh | H01L 31/035236 136/244 |
| 2011/0155233 A1* | 6/2011 | Liu | H01L 31/0352 136/256 |
| 2012/0000518 A1* | 1/2012 | Tokioka | H01L 31/043 136/255 |
| 2012/0180854 A1* | 7/2012 | Bellanger | H01L 31/0687 136/255 |
| 2012/0285520 A1* | 11/2012 | Bedell | H01L 31/0687 438/57 |
| 2013/0014813 A1 | 1/2013 | Wang et al. | |
| 2013/0037095 A1* | 2/2013 | Forrest | H01L 31/0687 257/E31.02 |
| 2013/0048064 A1* | 2/2013 | McMahon | H01L 31/043 136/255 |
| 2013/0206219 A1* | 8/2013 | Kurtin | H01L 31/02168 136/255 |
| 2014/0182667 A1 | 7/2014 | Richards et al. | |

OTHER PUBLICATIONS

Ferguson et al., "Contact Adhesion of Thin Gold Films on Elastomeric Supports: Cold Welding Under Ambient Conditions," Science, vol. 253, No. 5021, pp. 776-778 (1991).

Kim et al., "Micropatterning of Organic Electronic Devices by Cold-Welding," Science, vol. 288, No. 5467, pp. 831-833 (2000).

* cited by examiner

| | SHORT CIRCUIT CURRENT (mA/cm2) | OPEN CIRCUIT VOLTAGE (V) | FILL FACTOR(%) | POWER CONVERSION EFFICIENCY (%) |
|---|---|---|---|---|
| TANDEM W/O DBR (CPB+CPB) | 5.6 | 1.80 | 66 | 6.7 |
| TANDEM W DBR (CPB+CPB) | 7.9 | 1.80 | 62 | 9.0 |

MECHANICALLY STACKED TANDEM PHOTOVOLTAIC CELLS WITH INTERMEDIATE OPTICAL FILTERS

This application is a national stage application under 35 U.S.C. § 371 of International Application Number PCT/US2016/020039, filed Feb. 29, 2016, which claims the benefit of U.S. Provisional Patent Application No. 62/126,326, filed Feb. 27, 2015, which is incorporated herein by reference in its entirety.

This invention was made with government support under DE-EE0006708 awarded by the U.S. Department of Energy. The government has certain rights in the invention.

The present disclosure is directed to multi-junction photovoltaic devices and methods of fabricating, and more particularly multi-junction photovoltaic devices for solar cells.

Multi-junction photovoltaic cells provide superior performance over single junction solar cells by increasing the wavelengths of the solar spectrum that can be absorbed by the photovoltaic cell, and also minimize thermalization losses associated with absorption of photons with greater energy than the band gap of a photoactive material. A solar cell should cover the near infrared solar spectrum in order to maximize the performance of conventional multi-junction organic solar cell. Yet many photoactive materials, such as organic compounds, do not efficiently absorb and generate electrical energy in the near infrared solar spectrum. Quantum dot solar cells effectively cover the near infrared spectrum out to and beyond the wavelength of 1 μm with reasonably high power conversion efficiency (>8%), as demonstrated by Chuang et al. in "Improved performance and stability in quantum dot solar cells through band alignment engineering." (Chia-Hao M. Chuang, Patrick R. Brown, Vladimir Bulović, and Moungi G. Bawendi, Improved performance and stability in quantum dot solar cells through band alignment engineering. 13 *Nat. Mater.*, 796 (2014)). However, quantum dot solar cells also strongly absorb in the visible spectrum. The broad absorption spectrum of quantum dot solar cells therefore limits the performance of multi-junction organic solar cell by absorbing shorter wavelength photons and thereby preventing those photons from either transmitting or reflecting into other sub-cells that are tuned to absorb the short wavelength photons region.

In one aspect, the present disclosure is directed to a multi-junction photosensitive device. In some embodiments, the device includes at least two photoactive layers and at least one optical filter layer. In some embodiments, the multi-junction device has an increased absorption spectrum relative to a single junction device.

In one aspect of the invention, the optical filter can be configured to selectively tune the wavelengths of at least one of reflection, transmission, and absorption of incident light. In some embodiments, the optical filter is configured to transmit long wavelength light. In some embodiments, the optical filter is configured to reflect short wavelength light. In some embodiments, the optical filter is configured to transmit short wavelengths. In some embodiments the optical filter may reflect long wavelength light. In some embodiments the optical filter may be a photonic crystal. In some embodiments, the photonic crystal may comprise multiple layers of alternating materials with at least two different refractive indices. In some embodiments the photonic crystal may comprise a periodic grating of a waveguide material. In some embodiments, the optical filter may be a Distributed Bragg Reflector (DBR). In some embodiments, the optical filter may be a dichroic filter.

One aspect of the invention is directed to a multi-junction solar cell. In some embodiments the absorption of the solar cell covers at least some wavelengths of the solar spectrum. One aspect of the invention is directed to a multi-junction detector. In some embodiments the absorption of the multi-junction detector may comprise at least one wavelength outside the solar spectrum.

In one aspect, the present disclosure is directed to a method of fabricating a multi-junction photosensitive device comprising the steps of fabricating at least two photoactive layers, patterning at least one optical filter layer on the at least one photoactive layer fabricated on a transparent substrate, and bonding the at least two photoactive layers to at least one other layer. In some embodiments, at least one photoactive layer is fabricated on a transparent substrate. In some embodiments, at least one photoactive layer is fabricated on a reflective substrate. In some embodiments, cold weld bonding is used to bond the at least two photoactive layers to at least one other layer.

Each of FIG. 1-1, 1-2, 1-3, and 1-4 shows a schematic illustration of an exemplary fabrication flow for an exemplary organic/quantum dot multi-junction solar cell from individual sub-cells.

FIG. 1 shows a schematic illustration of an exemplary method of fabricating an exemplary multi-junction solar cell comprising sub-cells of organic and quantum dot photoactive layers.

Figure 11:
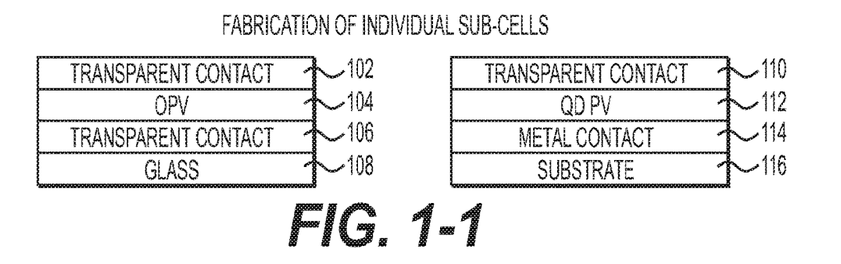

As shown in FIG. 1.1, the organic 104 and quantum dot 112 photoactive layers may be separately fabricated on different substrates, 108 and 116, respectively. In one embodiment, the organic photoactive layer 104 is the top sub-cell and is fabricated on a transparent substrate, such as glass 108, and employs transparent contacts 102, 106. According to this embodiment the quantum dot 112 photoactive layer may be the bottom layer and be fabricated on a nontransparent substrate 116, and employs at least one transparent contact 110, but may also include at least one metal contact 114. In some embodiments the transparent contacts may be ITO, IZO, AZO or PEDOT:PSS. In some embodiments, sub-cells may be fabricated on an individual substrate via vacuum thermal evaporation or solution process.

Figure 12:
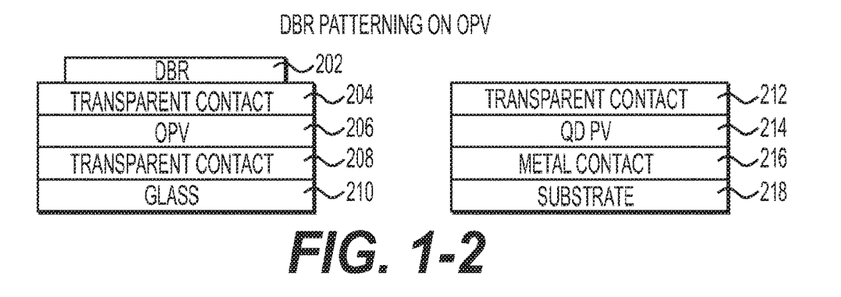
Figure 13:
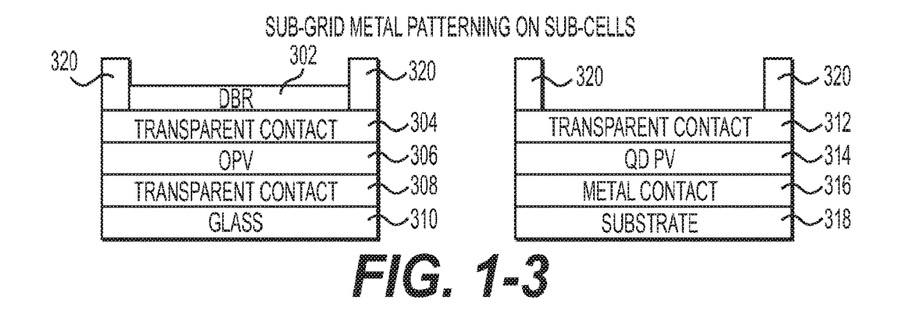

After individual sub-cell fabrication, an optical filter layer 202, 302 is patterned on the top sub-cell, as shown in FIG. 1.2. In some embodiments the optical filter layer is patterned using a shadow mask, though other patterning methods may be used. Then, a grid 320 is patterned on both the top and bottom sub-cells, as shown in FIG. 1.3. In some embodiments, the grid 320 employs a noble metal or metal coated with noble metal, such as Au or Al/Au, and thereby avoids oxidation and other contamination.

Following grid deposition, both sub-cells are bonded via van der Waals bonding or cold-welding by applying pressure along with or without a slight increase in temperature to encourage bonding. For reference, cold-weld bonding is described by Lee et al. in "Multiple growths of epitaxial lift-off solar cells from a single InP substrate" (Kyusang Lee, Kuen-Ting Shiu, Jeramy D. Zimmerman, Christopher K. Renshaw and Stephen R. Forrest, Multiple growths of epitaxial lift-off solar cells from a single InP substrate, 97 Appl. Phys. Lett., 101107 (2010)). For reference, cold-weld bonding is further described by Kim et al. in "Micropatterning of organic electronic devices by cold-welding" (Changsoon Kim, Paul E. Burrows, Stephen R. Forrest, Micropatterning of organic electronic devices by cold-welding. 288, *Science*, 831 (2000)). For reference, cold-weld bonding is further described by Ferguson et al. in "Contact adhesion of thin gold films on elastomeric supports: cold welding under ambient conditions" (Gregory S. Ferguson, Manoj K. Chaudhury, George. B. Sigal George M. Whitesides, Contact adhesion of thin gold films on elastomeric supports: cold welding under ambient conditions, 253 *Science*, 776 (1991)). For a cold-welding process, the surfaces of the epi-layer and the host substrate are generally pre-coated with layers of a similar noble metal (Au, Ni etc.), then appropriate pressure is applied between two metal interfaces. In some embodiments, metal contacts can be inserted in the regions that are cold-weld bonded to separately contact individual stacked elements. In various embodiments, the sub-cells do not require tunnel or interconnecting layers because sub-cells are connected by metal contacts in series, thereby considerably simplifying device fabrication. Application of this technique is not only limited to organic/quantum dot solar cells and other embodiments can be used for various solar cell structures (e.g. polymer, amorphous/poly-crystalline/single crystalline Si, germanium, III-V semiconductors, kesterite, perovskite etc.) to separate the solar spectrum by separately fabricating individual sub-cells, inserting intermediate optical filters, and then bonding the sub-cells using cold-welding. Such embodiments allow select wavelengths of light to pass through the top layer and be absorbed by the bottom layer, while reflecting other wavelengths of light to be absorbed in the top layer.

Figure 14:
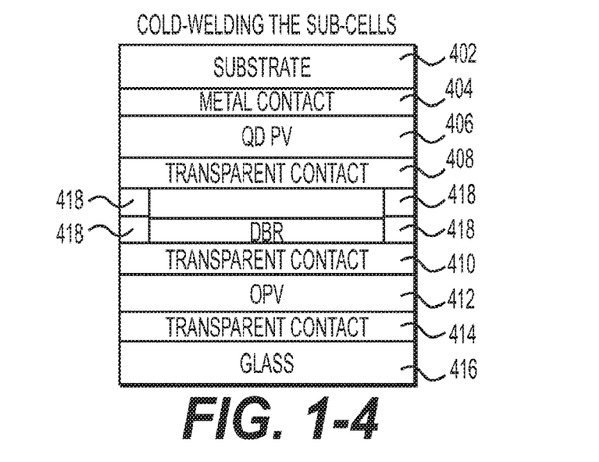

Following cold weld bonding, the two sub-cells are joined to form a multi-junction solar cell, as shown in FIG. 1.4. The incident light can pass through the glass layer 416 and select wavelengths of light are absorbed by the organic photovoltaic layer 412. Select wavelengths of light that are not absorbed by the organic photoactive layer 412 will reach the DBR, and said wavelengths will be transmitted or reflected depending on the configuration of the DBR. As shown in FIG. 1.4, the photoactive layer beyond the DBR is a quantum dot photoactive layer 406. In one embodiment, one photoactive layer is organic photoactive layer absorbs light in the visible and ultraviolet spectrums and the other photoactive layer is a quantum dot photoactive layer that absorbs light in the near-infrared spectrum. In such an embodiment, the DBR may be configured to reflect light in the visible spectrum and transmit light in the near infrared spectrum. Light that passes through the organic photoactive layer, the DBR and the quantum dot photoactive layer may be reflected or absorbed by the metal contact layer 404. In some embodiments the metal contact layer may serve as both an electrical contact and as a mirror on the back of the multi-junction solar cell.

In a multi-junction series-connected solar cell, the currents delivered by each sub-cell should be equal to maximize the solar cell performance. Alternatively, in a parallel cell (achieved using intermediate contacts) the voltage should be equalized between cells to maximize performance. Some embodiments may be comprised of a dual near infrared cell stack connected in parallel with a single shorter wavelength device, when parallel connection is desired in the design. In some embodiments wherein the device is a photodetector that is sensitive to multiple wavelength signal channels, there is no requirement for either balance of voltage or current.

The exemplary embodiment in FIG. 1 represents a double stacked device. Other embodiments may include additional photoactive elements, such as doped silicon or titanium dioxide, that may absorb different wavelengths of the solar spectrum or other wavelengths of interest. Optical filters, such as 202 and 302, may or may not be placed between each additional photoactive layer in the stack. Further, air gaps between layers may or may not be present. In some embodiments this device may be a photovoltaic device. In other embodiments, this device may be configured to be a photodetector that may de-multiplex narrow spectral signals emitted from a signal source.

One aspect of the present disclosure is related to a multi-junction photosensitive device. The multi-junction photosensitive device may comprise, at least two photoactive layers, and at least one optical filter layer, wherein at least two layers are bonded using cold weld or van der Waals bonding. In some embodiments, the at least one optical filter layer is a DBR. In some embodiments, the multi-junction device may comprise at least three photoactive layers, and at least two optical filter layers, wherein at least one optical filter layer is located between each photoactive layer.

In some embodiments, at least one photoactive layer may absorb wavelengths of light different than at least one other photoactive layer. In some embodiments, a photoactive layer below at least one other layer absorbs light in the near infrared. The near infrared spectrum includes wavelengths in the range of 0.75 to 1.4 microns. In some embodiments where the device is configured to be a photodetector, the wavelengths may include wavelengths up to 30 microns. In some embodiments, a photoactive layer, above at least one other layer, absorbs light in the ultraviolet spectrum. The ultraviolet spectrum includes wavelengths shorter than 400 nanometers. In some embodiments at least one photoactive layer absorbs a range of wavelengths of light spanning 10 nm different than at least one other photoactive layer.

In some embodiments, wavelength selective optical filter layers are placed between at least two photoactive layers of the multi-junction photosensitive device. In some embodiments an air gap between the photoactive layers may or may not be present.

In some embodiments, at least one photoactive layer is individually connected to a metal contact in regions that are cold weld or van der Waals bonded. In some embodiments, individual cells are connected in series. In some embodiments, individual cells are connected in parallel.

In some embodiments, at least one group of individual cells is connected in series and at least one group is connected in parallel. In some embodiments, at least one photoactive layer comprises materials chosen from organic photovoltaic, quantum dots, silicon, germanium, III-V semiconductors, kesterite, and perovskite. In some embodiments, at least one photoactive layer comprises PbS quantum dots.

In one aspect, the present disclosure is directed to a photodetector configured to de-multiplex spectral signals emitted from a signal source.

In one aspect, the present disclosure is directed to a method of fabricating a multi-junction photosensitive device. The method may include fabricating at least two photoactive layers, patterning at least one optical filter layer on the at least one photoactive layer fabricated on a transparent substrate, and bonding at least two photoactive layers using cold weld bonding. In some embodiments, at least one photoactive layer is fabricated on a transparent substrate. In some embodiments, at least one photoactive layer is fabricated on a reflective substrate. In some embodiments, at least one optical filter layer is a DBR. In some embodiments, the method further comprises fabricating at least one additional photoactive layer on a transparent substrate, and the transparent substrate may include a photoactive layer.

Figure 2:
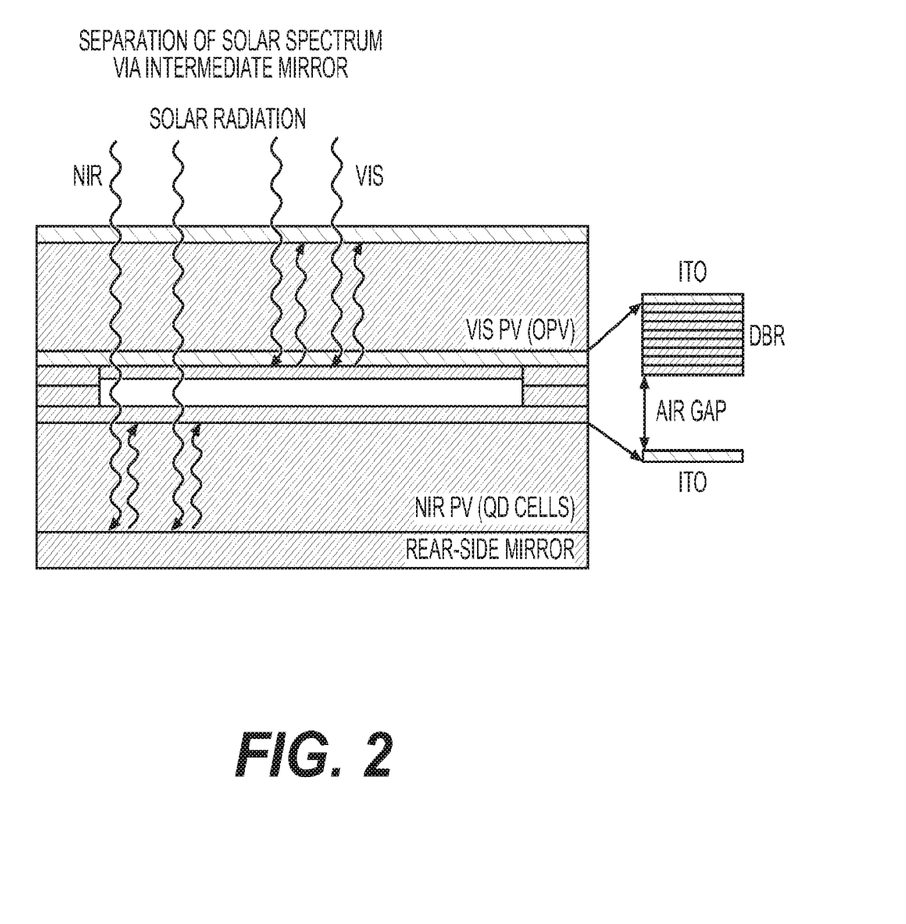
FIG. 2 shows a schematic illustration of the separation of the solar spectrum via an intermediate mirror in an exemplary organic/quantum dot multi-junction solar cell.

FIG. 2 shows a schematic illustration of the photon absorption process in an exemplary organic/quantum dot multi-junction solar cell. The exemplary mulitjunction solar cell is comprises a visible photovoltaic (VIS PV) which may be an organic photovoltaic layer (OPV), a DBR between two transparent contacts (ITO), a near infrared photovoltaic (NIR PV) which may be a quantum dot layer (QD cells), and a mirror on the back of the solar cell to reflect NIR light that is transmitted by the DBR and not initially absorbed by the NIR PV. The organic front sub-cell confines visible photons to the top sub-cell via a DBR, whereas only the near infrared light is transmitted into the bottom cell. The quantum dot bottom sub-cell has a metal contact reflector for near infrared light reflection. Using the intermediate optical filter, in this case a DBR, the solar spectrum can be selectively separated into sub-cells. A DBR is generally composed of alternating materials with at least two different refractive indices. Alternatively, a DBR may comprise a single material with a periodic variation of a characteristic (e.g. height) that results in variations of the effective refractive index. Reflection and transmission characteristics of the intermediate optical filter can be controlled by properly designing the DBR and/or the air gap thickness. Control over the reflection of the balance of photocurrent can be achieved between sub-cells to maximize the multi-junction solar cell performance. Also, due to the fact that the DBR will reflect select wavelengths of light back up through the organic layer, various embodiments may employ a thinner photoactive layer than necessary otherwise, because the optical path length of the organic layer will be lengthened as the light passes through the photoactive layer again after reflection.

Figure 3A:
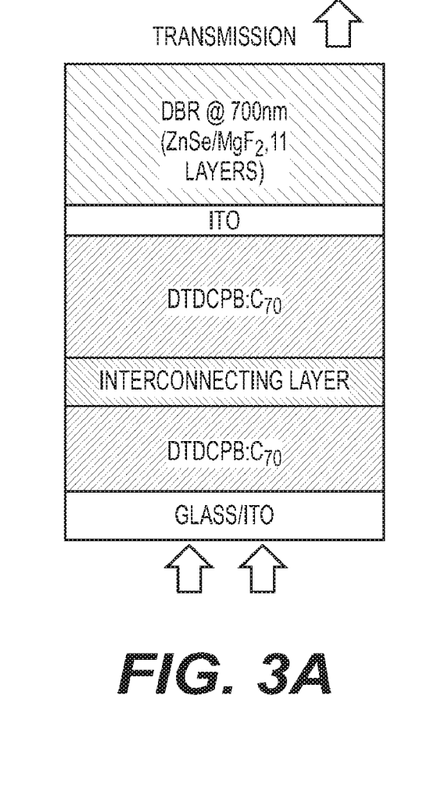
FIG. 3A shows a schematic of a single junction solar cell with a DBR as an optical filter layer.
Figure 3B:
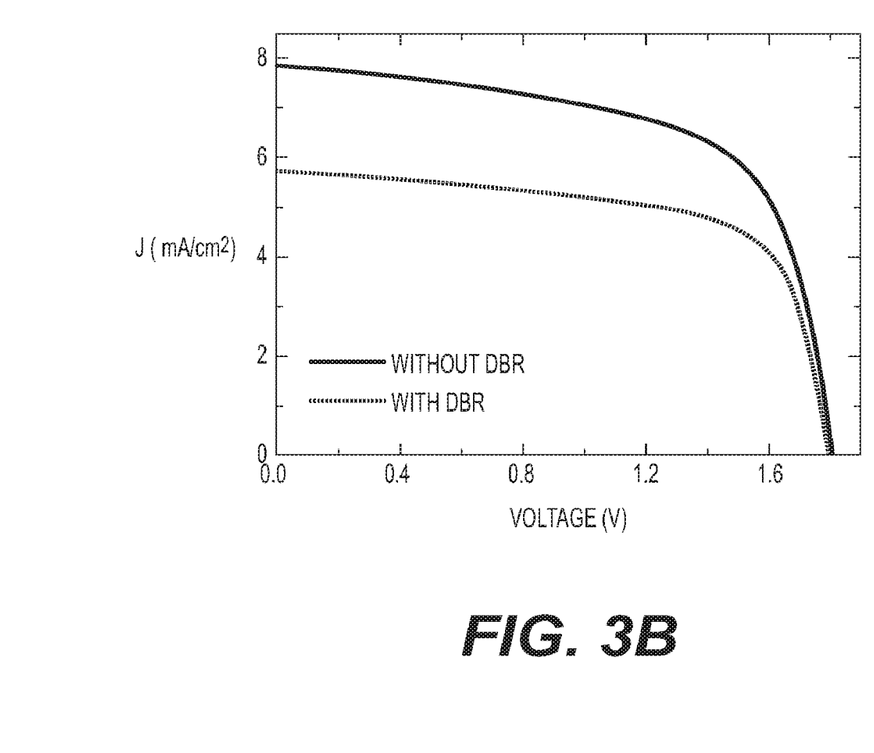
FIG. 3B shows a graph of the measured photocurrent versus voltage for a single junction solar cell fabricated according to the layers in FIG. 3A.
Figure 4:
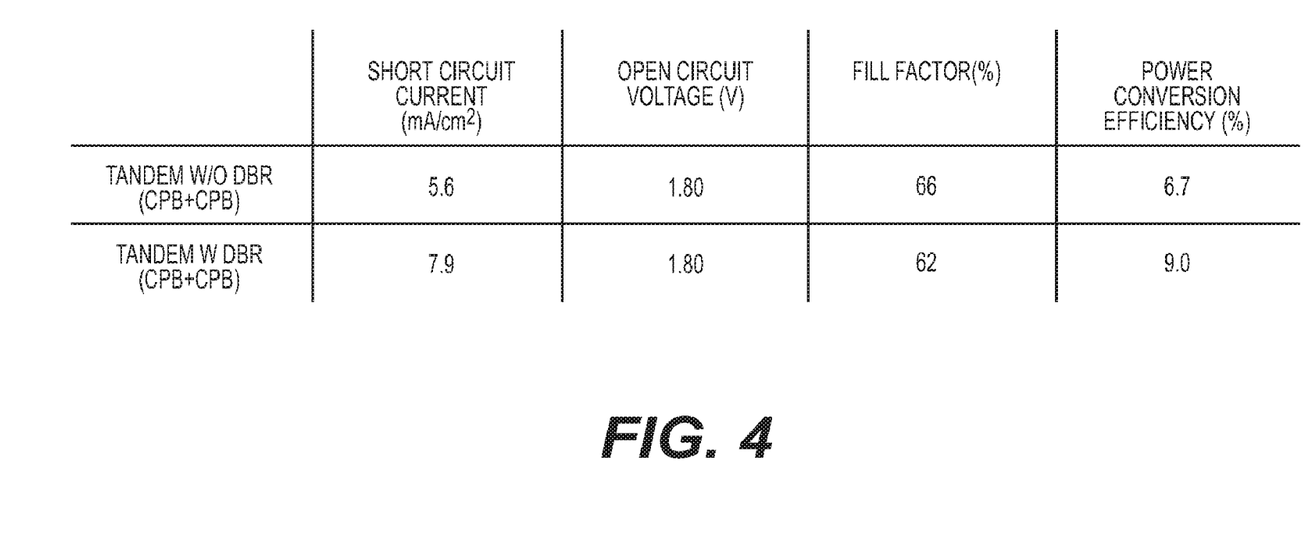
FIG. 4. shows a table summarizing the performance of a single junction solar cell with and without a DBR optical filter.
Figure 5:
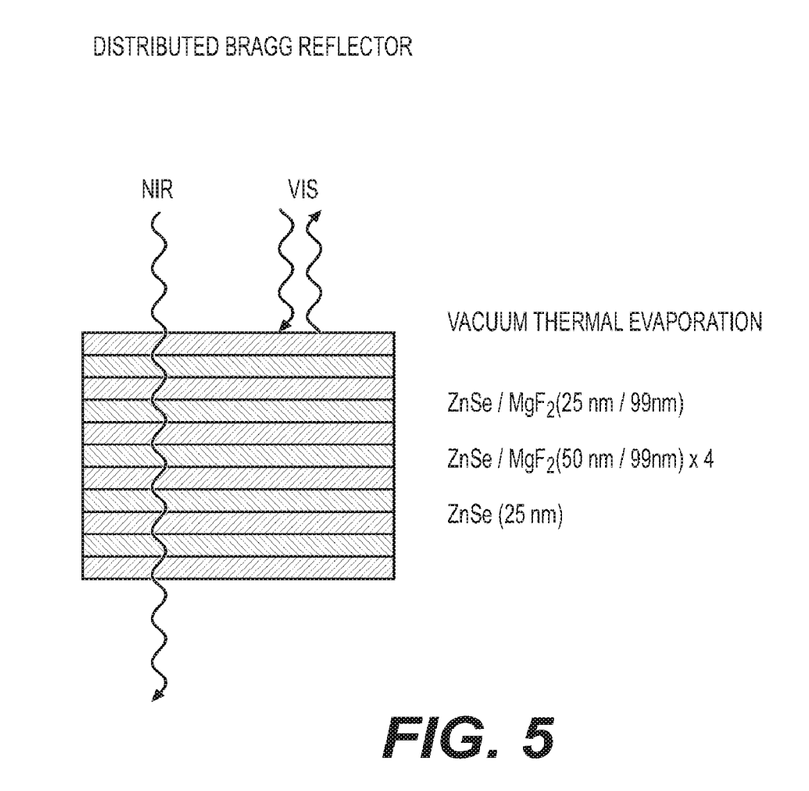
FIG. 5 shows a schematic of an exemplary DBR as an optical filter layer.
Figure 6:
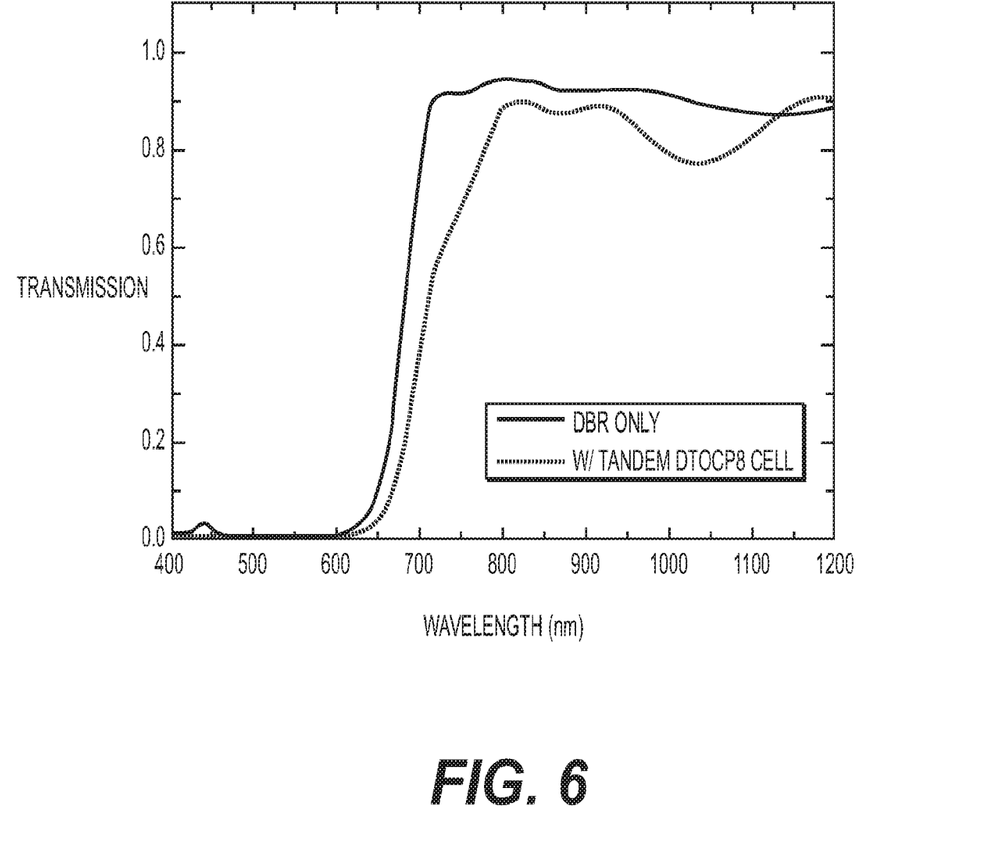
FIG. 6 shows a graph of the transmittance of light versus wavelength of light for the DBR of FIG. 5.

A solar cell fabricated according to the layers shown in FIG. 3A demonstrates one envisioned benefit of an optical filter layer. The solar cell includes organic photoactive layers comprising DTDCPB:$C_{70}$ layers and an interconnecting layer between the organic photoactive layers. The photoactive layers are situated between transparent contact layers (ITO), and the DBR is situated on the rear, relative to incident light, of the solar cell. The DBR of FIG. 3A comprises eleven alternating layers of Zinc Selenide and Magnesium Fluoride, configured such that the DBR has an onset of transmission of for light with a wavelength greater than 700 nm. The DBR of FIG. 3B is abbreviated as DBR@700 nm, ZnSe/MgF$_2$ and is described in more detail in FIG. 5. FIG. 3B shows a graph of the measured photocurrent versus voltage for a solar cell fabricated according to the layers in FIG. 3A, compared to a solar cell fabricated according to the same layers except for the DBR layer, as in FIG. 3A. The results of the solar cell performance are summarized in FIG. 4 illustrate the increased power conversion efficiency of a solar cell when utilizing a DBR. FIG. 5 shows a schematic of the exemplary DBR shown in FIG. 3A, and comprises a total of eleven layers of ZnSe and MgF$_2$. The transmission of the solar cell of FIG. 3A and the DBR alone is shown in the graph of FIG. 6, and illustrates an onset of transmission of light for wavelengths longer than 700 nm, while the wavelengths of light shorter than 700 nm are at least partially reflected.

Other embodiments of the present disclosure will be apparent to those skilled in the art from consideration of the specification and practice of the present disclosure herein. It is intended that the specification and examples be considered as exemplary only, with a true scope and spirit of the present disclosure being indicated by the following claims.

What is claimed is:
1. A multi-junction photosensitive device comprising:
a first subcell disposed on a reflective substrate, wherein the first subcell comprises at least a first photoactive layer situated on a first transparent contact wherein the first transparent contact is precoated with a noble metal;
a second subcell disposed on a transparent substrate, wherein the second subcell comprises at least a second photoactive layer situated on a second transparent contact wherein the second transparent contact is precoated with a noble metal, wherein the first and second subcells are located between the reflective substrate and the transparent substrate in a stacked configuration, and wherein the first and second subcells are cold-weld bonded to one another by a metal grid that physically and electrically interconnects the subcells by applying pressure on each of the first transparent contact and the second transparent contact, and
at least one optical filter layer located between the first and second subcells,
wherein the first photoactive layer comprises PbS quantum dots and the second photoactive layer comprises an organic photovoltaic,
wherein the first and second photoactive layers absorb different wavelengths of light.
2. The device of claim 1, wherein the at least one optical filter layer is a Distributed Bragg Reflector.
3. The device of claim 1, further comprising:
a third subcell disposed on an additional transparent substrate and comprising at least a third photoactive layer; and
at least one additional optical filter layer located between the second and third subcells.
4. The device of claim 1, wherein the first photoactive layer is located below the second photoactive layer and absorbs light in the near infrared spectrum.
5. The device of claim 1, wherein the second photoactive layer is located above the first photoactive layer and absorbs light in the ultraviolet spectrum.
6. The device of claim 1, wherein the first photoactive layer absorbs a range of wavelengths of light spanning 10 nm that is not absorbed by the second photoactive layer.
7. The device of claim 1, wherein the at least one optical filter layer is wavelength selective.
8. The device of claim 1, wherein there is no air gap between the first and second subcells.
9. The device of claim 1, wherein an intermediate metal contact is connected to the metal grid.
10. The device of claim 1, wherein the first and second subcells are connected in series.
11. The device of claim 9, wherein the first and second subcells are connected in parallel.

12. The device of claim 3, wherein at least one group of individual subcells is connected in series and at least one group of individual subcells is connected in parallel.

13. The device of claim 1, wherein the at least first and second photoactive layers comprise materials chosen from silicon, germanium, III-V semiconductors, kesterite, and perovskite.

14. The device of claim 1, wherein the device is a photodetector configured to demultiplex spectral signals emitted from a signal source.

15. The device of claim 1, wherein the metal grid comprises a noble metal.

* * * * *